United States Patent [19]
Suda

[11] Patent Number: 5,310,691
[45] Date of Patent: May 10, 1994

[54] METHOD OF MANUFACTURING SEMICONDUCTOR DEVICE INCLUDING FORMATION OF ALIGNMENT MARK

[75] Inventor: Kakutaro Suda, Itami, Japan

[73] Assignee: Mitsubishi Denki Kabushiki Kaisha, Tokyo, Japan

[21] Appl. No.: 67,955

[22] Filed: May 27, 1993

Related U.S. Application Data

[62] Division of Ser. No. 793,942, Oct. 22, 1991, Pat. No. 5,256,898.

[30] Foreign Application Priority Data

Nov. 6, 1990 [JP] Japan ................... 2-301543

[51] Int. Cl.$^5$ .................... H01L 21/265
[52] U.S. Cl. .................... 437/31; 437/69; 437/56; 437/34; 437/67; 437/924
[58] Field of Search .......... 437/34, 69, 56–58, 437/67, 924, 31; 148/DIG. 102; 257/653, 654

[56] References Cited

U.S. PATENT DOCUMENTS 4,554,726 11/1985 Hillenius et al. .................... 29/571
5,134,082 7/1992 Kirchgessner .................... 437/57
5,225,365 7/1993 Cosentino .................... 437/57

FOREIGN PATENT DOCUMENTS 61-236155 4/1985 Japan.
3-227055 10/1991 Japan.

*Primary Examiner*—George Fourson
*Assistant Examiner*—David Mason
*Attorney, Agent, or Firm*—Oblon, Spivak, McClelland, Maier & Neustadt

[57] ABSTRACT

A p$^-$ semiconductor substrate has a surface which is high in a memory cell region and low in a peripheral circuit region. An n$^+$ buried semiconductor layer of uniform thickness is formed on the substrate. An n$^-$ epitaxial layer formed on the buried semiconductor layer is thin in the memory cell region and thick in the peripheral circuit region, so that the surface of the epitaxial layer can be flat. A concave or convex step is formed on the surface of the epitaxial layer in a boundary portion between the memory cell region and the peripheral circuit region in order to use it as an alignment mark in a later processing step.

15 Claims, 9 Drawing Sheets

5,310,691

METHOD OF MANUFACTURING SEMICONDUCTOR DEVICE INCLUDING FORMATION OF ALIGNMENT MARK

This is a division of application Ser. No. 07/793,942, filed on Oct. 22, 1991, now U.S. Pat. No. 5,256,898.

BACKGROUND OF THE INVENTION

1. Field of the Invention

The present invention relates to a semiconductor device and a method of manufacturing the same in which a difference is made between adjacent circuit regions in the thickness of the same conductivity type epitaxial layer with low impurity concentration formed on a high impurity concentration of a buried semiconductor layer.

2. Description of the Background Art

A random access memory which employs a bipolar transistor preferably has a measure of large collector-base junction capacitance of a transistor which constitutes a memory cell in order to prevent information inversion by radioactive rays, which is called a software error. On the other hand, a transistor which constitutes a peripheral circuit for determining the operating speed of the memory preferably has small collector-base junction capacitance from the viewpoint of the achievement of high-speed operation.

FIG. 5 is a cross-sectional view of an example of conventional semiconductor devices formed to satisfy both of the above mentioned conditions. In FIG. 5, a high impurity concentration of an n+ buried semiconductor layer 2 is formed on a p− semiconductor substrate 1. On the n+ buried semiconductor layer 2 is formed a low impurity concentration of an n− epitaxial layer 3. The epitaxial layer 3 is adapted to be relatively thin in a memory cell region and relatively thick in a peripheral circuit region. The memory cell region and the peripheral circuit region are divided into a plurality of element regions by groove-type isolating layers 5. In predetermined element regions, p diffusion layers 4 are formed on the surface of the n− epitaxial layer 3. The n− epitaxial layer 3 acts as a collector of a transistor, and the p diffusion layers 4 act as bases thereof.

Assuming that the p diffusion layers 4 in the memory cell region are as deep as the p diffusion layers 4 in the peripheral circuit region, the distance between the p diffusion layers 4 and the n+ buried semiconductor layer 2 is short in the memory cell region, compared with the distance therebetween in the peripheral circuit region. Accordingly, the depletion layer width of the collector-base junction is small in the memory cell region, compared with the depletion layer width thereof in the peripheral circuit region. As a result, collector-base junction capacitance $C_1$ in the memory cell region can be increased while collector-base junction capacitance $C_2$ in the peripheral circuit region is held small.

With reference to FIGS. 6A to 6F, a method of manufacturing the semiconductor device of FIG. 5 is described hereinafter. As shown in FIG. 6A, n impurity ions are injected onto the surface of the p− semiconductor substrate 1. The injected impurities are thermally diffused to form the n+ buried semiconductor layer 2. Subsequently, as shown in FIG. 6B, the n− epitaxial layer 3 is grown on the buried semiconductor layer 2. As shown in FIG. 6C, an oxide film 101 is formed on the epitaxial layer 3. On the oxide film 101 is formed a nitride film 102 only in the peripheral circuit region.

As shown in FIG. 6D, masked with the nitride film 102, selective oxidation is performed to thereby form an oxide film 103 in the memory cell region. Hence, the n− epitaxial layer 3 is made thinner in the memory cell region. It is well known that the thickness of the oxide film 103 is required to be about 1/0.45 times the thickness of the thinned n− epitaxial layer 3, in the case that the n− epitaxial layer 3 is made of silicon. As shown in FIG. 6E, the nitride film 102 and the oxide films and 103 are entirely removed. A stair formed on the surface of the n− epitaxial layer 3 is used as an alignment mark in a later step. After the step of FIG. 6E, the groove-type isolating layers 5 with the depth from the surface of the n− epitaxial layer 3 to the p− semiconductor substrate 1 are formed, as shown in FIG. 6F. For example, in this step, the stair is used for the alignment of a photomask for transferring a groove pattern. Subsequently, the element regions which have been isolated from each other by the groove-type isolating layers 5 are, as required, formed with transistors, so that the structure of FIG. 5 is achieved.

In the prior art, the n− epitaxial layer 3 is reduced in thickness in the memory cell region to be thinner than the n− epitaxial layer 3 in the peripheral circuit region for the purpose of increasing the collector-base junction capacitance of the transistor in the memory cell region in comparison with the collector-base junction capacitance thereof in the peripheral circuit region. Accordingly, the stair is generated on the surface of the n− epitaxial layer 3 between the memory cell region and the peripheral circuit region. This surface stair of the epitaxial layer 3 is necessary as the alignment mark in the later step, however, causes the following problems described below.

When a photoresist layer is applied by a spin coater, the photoresist on the lower step in the vicinity of the stair is thicker than the photoresist in the other regions. The lower step in the vicinity of the stair is different from the other regions in the pattern dimension of the photoresist after exposure and development. FIG. 7 is a cross-section view of a semiconductor device illustrating an example of such problems. After the formation of an insulating film 6 on the n− epitaxial layer 3, a photoresist layer 7 coats the insulating film 6 by the spin coater, and is exposed and developed according to a desired aperture pattern to form apertures in the insulating layer 6, so that the structure FIG. 7 is achieved. As shown in FIG. 7, the thickness $R_2$ of the photoresist layer 7 on the lower step in the vicinity of the stair of the n− epitaxial layer 3 is large in comparison with the thicknesses $R_1$ and $R_3$ thereof on the lower and upper steps far apart from the stair. Accordingly, the pattern dimension after the exposure and development, that is, a pattern width $S_2$ at the portion with the thickness $R_2$ is small in comparison with pattern widths $S_1$ and $S_3$ at the portions with the thicknesses $R_1$ and $R_3$. As a result, there has been a problem that a desired aperture width cannot be achieved at the portion with the thickness $R_2$ when the insulating film 6 is etched, masked with the photoresist film 7, to form the apertures.

SUMMARY OF THE INVENTION

According to the present invention, a semiconductor device comprises a first conductivity type semiconductor substrate having a first region formed with a relatively high surface and a second region adjacent to the first region and formed with a relatively low surface, a second conductivity type buried semiconductor layer of a relatively high impurity concentration with substantially uniform thickness form ed on the semiconductor substrate in the first and second regions, and a second conductivity type epitaxial layer of a relatively low impurity concentration formed on the buried semiconductor layer, wherein the epitaxial layer has a surface which is the same height in the first and second regions and which is formed with a concave or convex step in a boundary portion between the first and second regions.

The present invention is also intended for a method of manufacturing a semiconductor device. According to the present invention, the method comprises the steps of preparing a first conductivity type semiconductor substrate, selectively removing a surface of the semiconductor substrate to thereby providing the semiconductor substrate with a first region formed with a relatively high surface and a second region adjacent to the first region and formed with a relatively low surface, forming a second conductivity type buried semiconductor layer of a relatively high impurity concentration with substantially uniform thickness formed on the semiconductor substrate in the first and second regions, growing a second conductivity type epitaxial layer of a relatively low impurity concentration in substantially uniform thickness on the buried semiconductor layer, and selectively removing the epitaxial layer in the first region to thereby equalize a height of a surface of the epitaxial layer in the first and second regions, and to provide the surface of the epitaxial layer with a concave or convex step in a boundary portion between the first and second regions.

According to the present invention, the semiconductor substrate has a stair between the first and second regions, and accordingly the buried semiconductor layer with uniform thickness formed on the semiconductor substrate has a stair on the surface thereof between the first and second regions. Hence, the epitaxial layer can have different thicknesses between the first and second regions without a stair on the surface of the epitaxial layer formed on the buried semiconductor layer between the first and second regions. The concave or convex step formed on the surface of the epitaxial layer in the boundary portion between the first and second regions can become an alignment mark in a later step.

In other words, according to the present invention, the semiconductor substrate and the buried semiconductor layer are provided with high surfaces in the first region and low surfaces in the second region. The epitaxial layer formed thereon is thin in the first region and thick in the second region. Therefore, no difference in height is generated on the surface of the epitaxial layer between the first and second regions. The concave or convex step is formed on the surface of the epitaxial layer in the boundary portion between the first and second regions. Therefore the step can be used as an alignment mark in a later step.

Accordingly, an object of the present invention is to provide a semiconductor device and a method of manufacturing the same in which no difference in height is generated on the surface of an epitaxial layer between first and second regions, in which the epitaxial layer in the first region is thinner than that in the second region and in which an alignment mark for a later step can be left.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
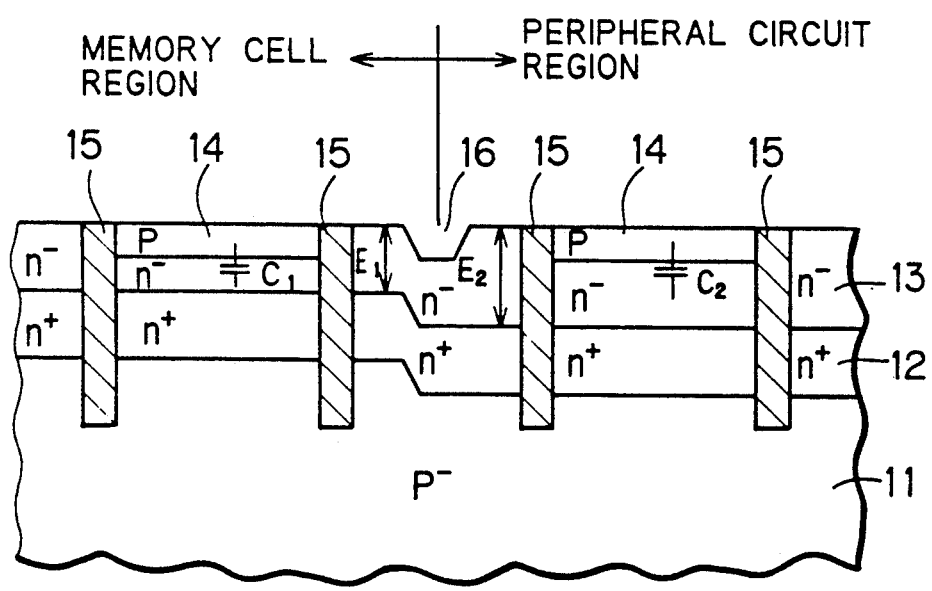
FIG. 1 is a cross-sectional view of a preferred embodiment of a semiconductor device according to the present invention.

FIG. 1 is a cross-sectional view of a preferred embodiment of a semiconductor device according to the present invention. In FIG. 1, there is provided a stair on the surface of a $p^-$ semiconductor substrate between a memory cell region and a peripheral circuit region. The surface of the $p^-$ semiconductor substrate 11 is formed to be high in the memory cell region and low in the peripheral circuit region. On the surface of the $p^-$ semiconductor substrate 11 is formed a high impurity concentration of an $n^+$ buried semiconductor layer 12 with substantially uniform thickness. Accordingly, the buried semiconductor layer 12, on the surface, is provided with a stair between the memory cell region and the peripheral circuit region.

A low impurity concentration of an $n^-$ epitaxial layer 13 is formed on the surface of the $n^+$ buried semiconductor layer 12. The surface of the epitaxial layer 13 in the memory cell region is as high as that in the peripheral circuit region. For this reason, the epitaxial layer 13 is thin ($E_1$) in the memory cell region and thick ($E_2$) in the peripheral circuit region. The epitaxial layer 13, on the surface, is provided with a concave step 16 in the boundary region between the memory cell region and the peripheral circuit region.

The memory cell region and the peripheral circuit region are divided into a plurality of element regions by trench isolating layers 15. Predetermined element regions are formed with p diffusion layers 14 on the surface of the $n^-$ epitaxial layer 13. The $n^-$ epitaxial layer 13 acts as a collector of a transistor, and the p diffusion layers 14 act as bases of the transistor.

Assuming that the p diffusion layers 14 in the memory cell region are as deep as the p diffusion layers 14 in the peripheral circuit region, the distance between the p diffusion layers 14 and the $n^+$ buried semiconductor layer 12 is short in the memory cell region in comparison with the distance therebetween in the peripheral circuit region. Accordingly, the depletion layer width of collector-base junction is small in the memory cell region in comparison with the depletion layer width thereof in the peripheral circuit region. As a result, collector-base junction capacitance $C_1$ in the memory cell region can be increased while collector-base junction capacitance $C_2$ in the peripheral circuit region is held small.

Furthermore, the concave step 16 is provided on the surface of the n⁻ epitaxial layer 13 in the boundary region between the memory cell region and the peripheral circuit region. This step 16 acts as an alignment mark in a later processing step.

Figure 2A:
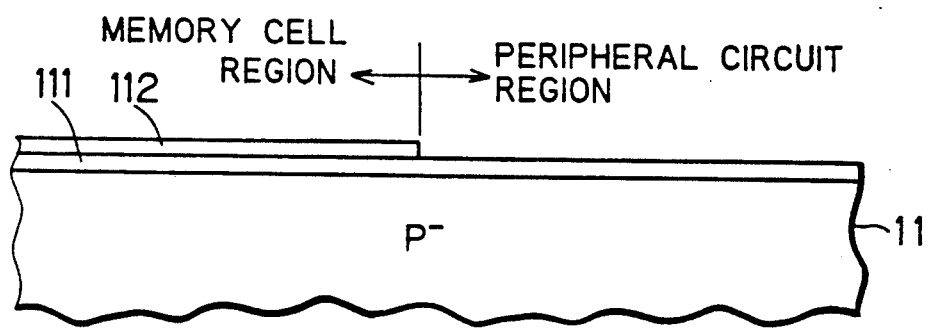
FIGS. 2A to 2H are cross-sectional views of a preferred embodiment of a method of manufacturing the semiconductor device of FIG. 1.
Figure 2B:
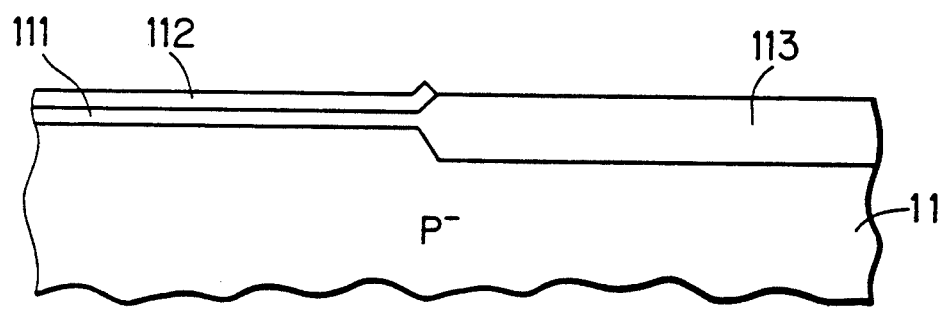

With reference to FIGS. 2A to 2H, a preferred embodiment of a method of manufacturing the semiconductor device of FIG. 1 is described hereinafter. As shown in FIG. 2A, an oxide film is formed on the p⁻ semiconductor substrate 11, for example, by thermal oxidation. On the oxide film 111 is formed a nitride film 112, for example, by CVD, which is left only in the memory cell region by selective etching. As shown in FIG. 2B, masked with the nitride film 112, selective oxidation (LOCOS) is performed to form an oxide film 113 in the peripheral circuit region. Hence, the p⁻ semiconductor substrate 11 is made thinner in the peripheral circuit region. It is well known that the thickness of the oxide film 113 is required to be about 1/0.45 times the thickness of the thinned p⁻ semiconductor substrate 11, in the case that the p⁻ semiconductor substrate is made of silicon. For example, an oxide film 113 of 0.89 ⅜m should be formed by vapor oxidation at 950° C. for about 300 minutes in order to reduce the semiconductor substrate 11 composed of a silicon substrate by 0.4 μm.

Figure 2C:
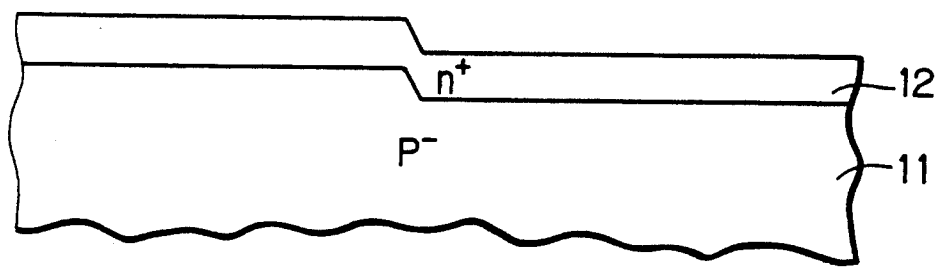
Figure 2D:
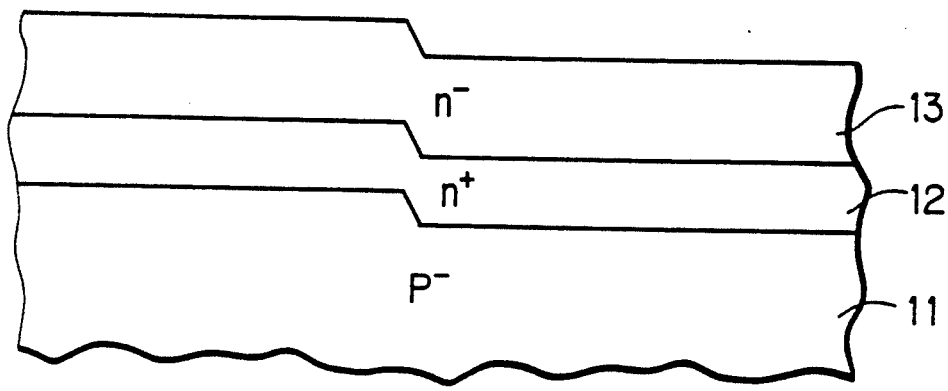
Figure 2E:
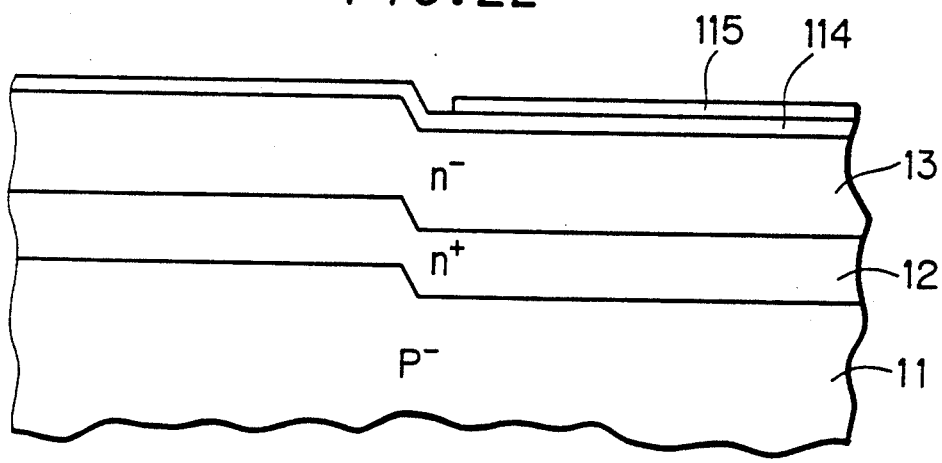

As shown in FIG. 2C, the nitride film 112 and the oxide films 111 and 113 are entirely removed. By ion implantation and the like, n-type impurities such as arsenic and antimony are introduced into the surface of the p⁻ semiconductor substrate 11 and thermally diffused to form the n+ buried semiconductor layer 12. As shown in FIG. 2D, the n⁻ epitaxial layer 13 is epitaxially grown on the n+ buried semiconductor layer 12. Subsequently, as shown in FIG. 2E, an oxide film 114 is formed on the epitaxial layer 13, for example, by thermal oxidation. On the oxide film 114 is formed a nitride film 115, for example, by CVD, which is left only in the peripheral circuit region by selective etching. An edge of the nitride film 115 is designed to be on the peripheral circuit region side a little apart from the boundary region between the memory cell region and the peripheral circuit region. In this case, it is necessary to estimate alignment errors in patterning the nitride film 15 so that an edge of the nitride film 115 is securely on the peripheral circuit region side.

Figure 2F:
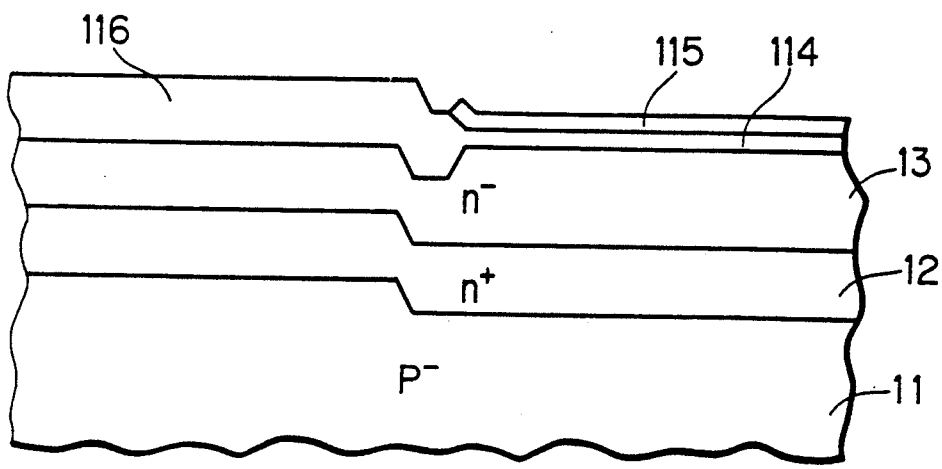

As shown in FIG. 2F, masked with the nitride film 115, selective oxidation (LOCOS) is performed to form an oxide film 116 in the memory cell region. The n⁻ epitaxial layer 13 is thereby made thinner in the memory cell region. The conditions for forming the oxide film 116 is adapted to be similar to those for forming the oxide film 113 in the step of FIG. 2B. Hence, the oxide film 116 with the same thickness as the oxide film 113 is formed. As a result, the surface of the n⁻ epitaxial layer 13 in the memory cell region is as high as that in the peripheral circuit region. Since an edge of the nitride film 115 is designed to be on the peripheral circuit region side a little apart from the boundary region between the memory cell region and the peripheral circuit region, the surface of the n⁻ epitaxial layer 13 is dented in a concave shape by the oxide film 116 in the boundary region.

Figure 2G:
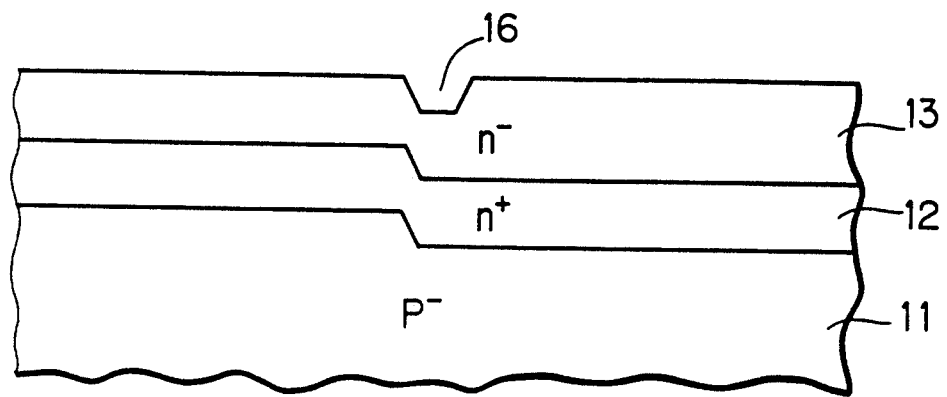

As shown in FIG. 2G, the nitride film 115 and the oxide films 114 and 116 are entirely removed. The resulting surface of the n⁻ epitaxial layer 13 is flat and is provided with the concave stair 16 in the boundary region between the memory cell region and the peripheral circuit region. Either edge of the stair 16 can be used as the alignment mark in the later step.

Figure 2H:
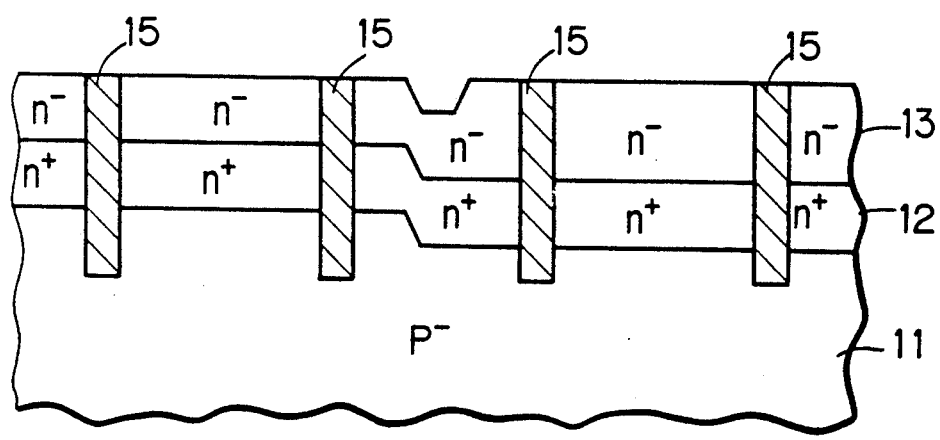

Thereafter, as shown in FIG. 2H, the trench isolating layers 15 with a depth from the surface of the n⁻ epitaxial layer 13 to the p⁻ semiconductor substrate 11 are formed. This formation comprises the steps of forming grooves by anisotropic etching, depositing an oxide film by CVD, and removing the oxide film outside the grooves by etchback. In this step, the stair 16 can be used as the alignment mark when a photomask for transferring a groove pattern is aligned with a photoresist (not shown) for anisotropic etching. Subsequently, the element regions which are isolated from each other by the trench isolating layers 15 are, as required, formed with transistors.

Figure 3A:
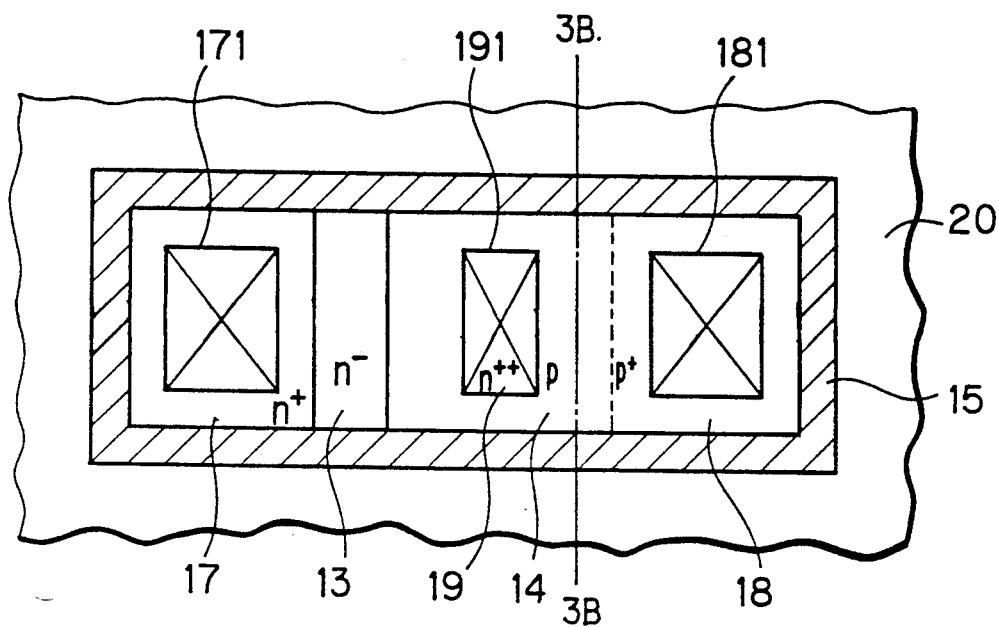
FIG. 3A is a plan view of a single element region.
Figure 3B:
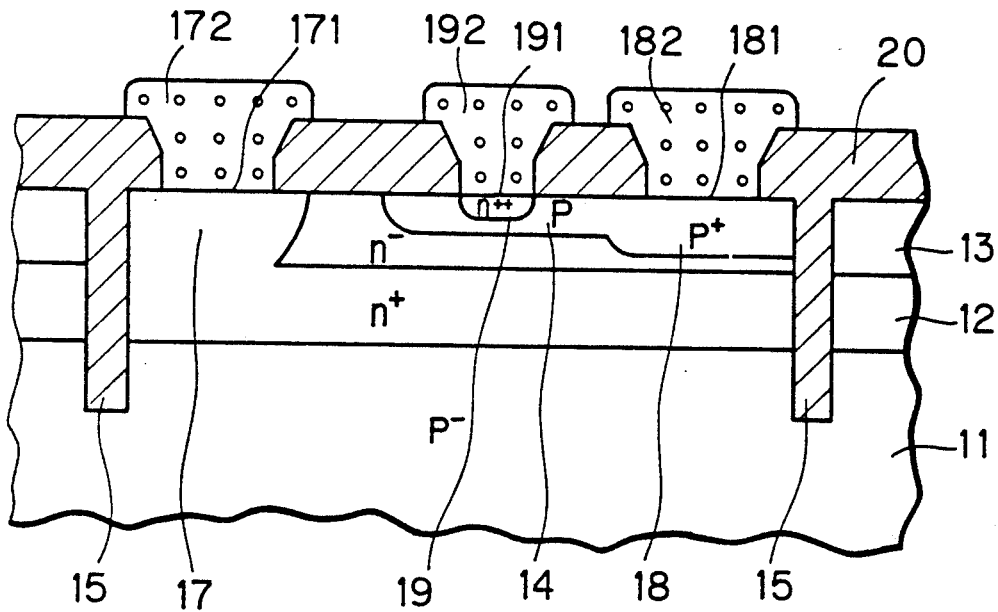
FIG. 3B is a cross-sectional view taken along the line B-B' of FIG. 3A.

FIG. 3A is a plan view of a single element region formed with an npn transistor. FIG. 3B is a cross-sectional view taken along the line B-B' of FIG. 3A. The cross-sectional structure (of a single element region) taken along the line A-A' of FIG. 3A is shown in FIG. 1. The shown npn transistor comprises a collector region composed of the n⁻ epitaxial layer 13, a base region composed of the p diffusion layer 14, and an emitter region composed of an n++ diffusion layer 19. A passivation film 20 formed on the top surface is provided with contact holes 171, 181 and 191 for collector, base and emitter, respectively. A collector electrode 172, a base electrode 182 and an emitter electrode 192 are formed in the contact holes 171, 181 and 191, respectively. The collector electrode 172 is connected through an n+ collector electrode extraction layer 17 to the n+ buried semiconductor layer 12 which acts as a buried collector. The base electrode 182 is connected through a p+ external base layer 18 to the p diffusion layer 14 which is the base region. The emitter electrode 192 is directly connected to the n++ diffusion layer 19 which is the emitter region.

In the preferred embodiment of FIG. 1, the stair 16 is concave. However, the stair 16 may be convex. A preferred embodiment of a method of manufacturing a semiconductor device having such a convex stair is described hereinafter with reference to FIGS. 4A to 4C. The steps of FIGS. 4A to 4C correspond to those of FIGS. 2E to 2G in the aforesaid method, and the other steps in this method are completely similar to those in the aforesaid method.

Figure 4A:
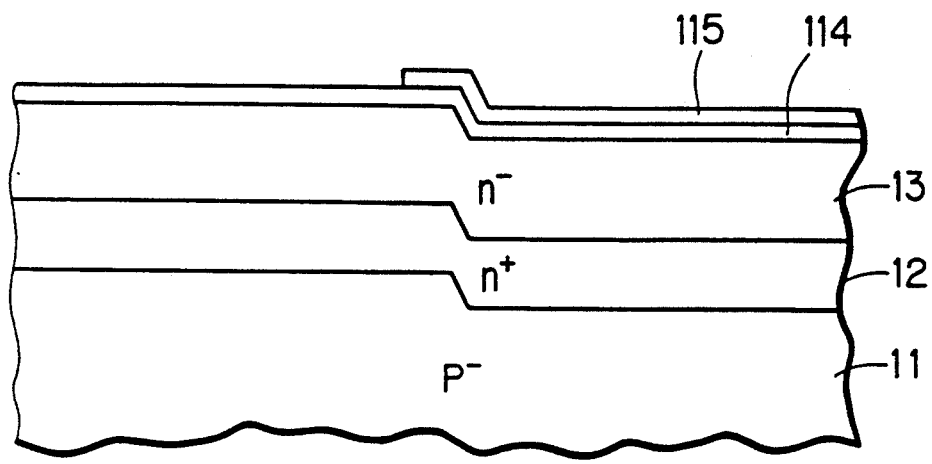
FIGS. 4A to 4C are cross-sectional views of another preferred embodiment of the method of manufacturing the semiconductor device according to the present invention.
Figure 4B:
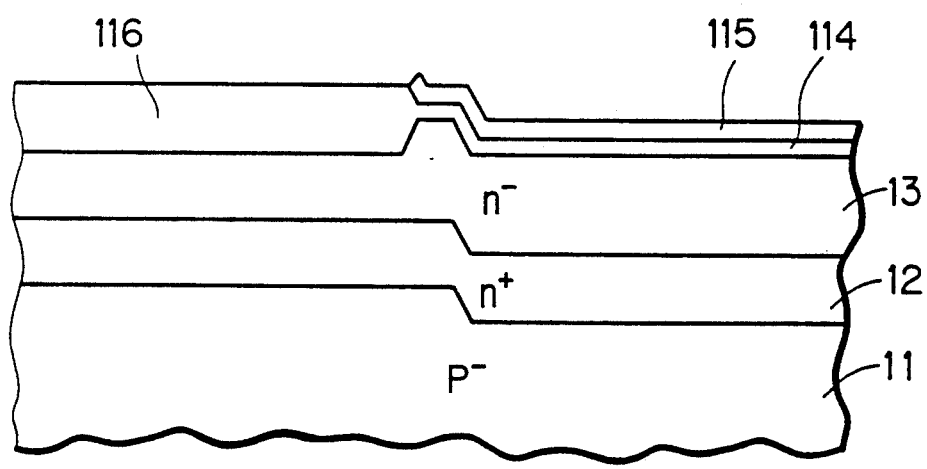
Figure 4C:
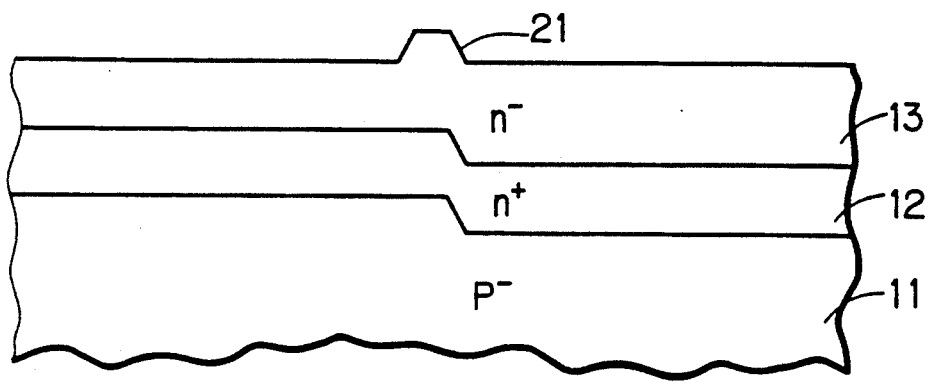
Figure 5:
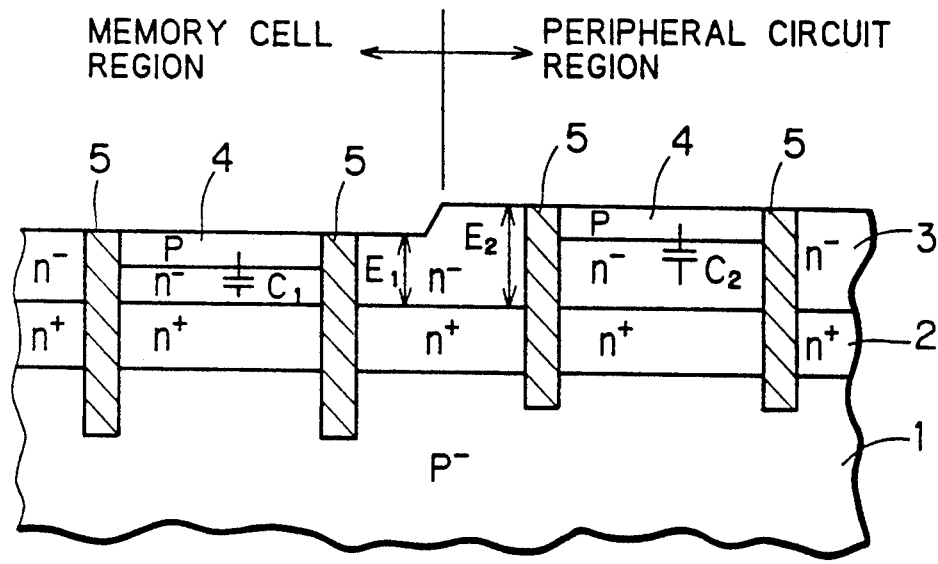
FIG. 5 is a cross-sectional view of a conventional semiconductor device.
Figure 7:
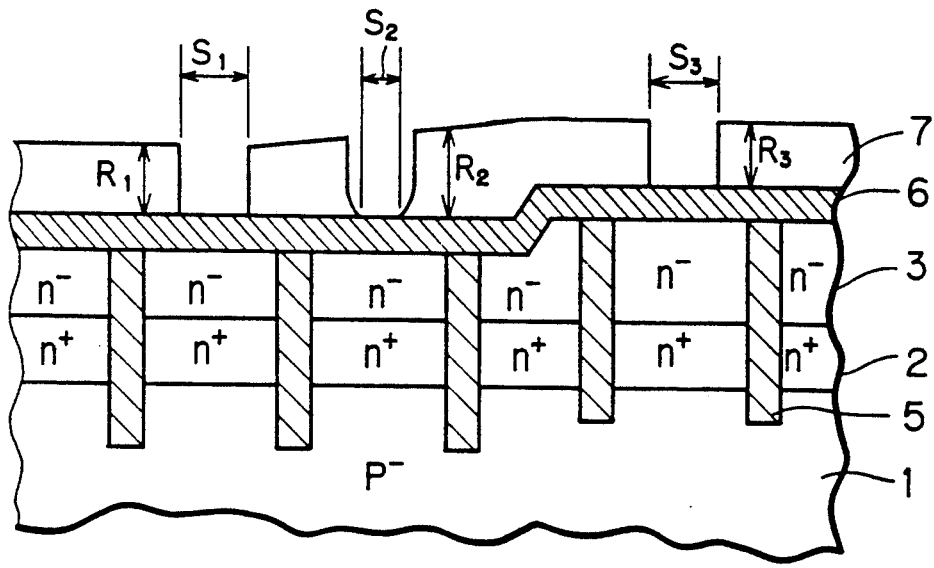
FIG. 7 is a cross-sectional view of a conventional semiconductor device in unpreferable condition.
Figure 6A:
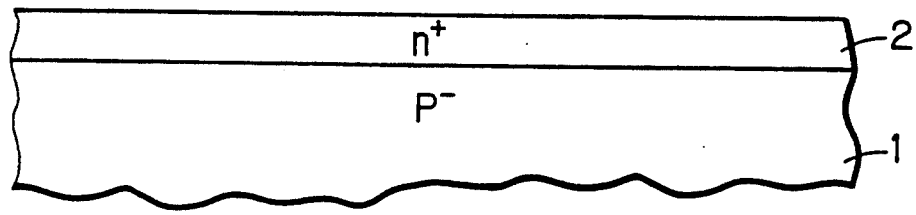
FIGS. 6A to 6F are cross-sectional views of a method of manufacturing the semiconductor device of FIG. 5.
Figure 6B:
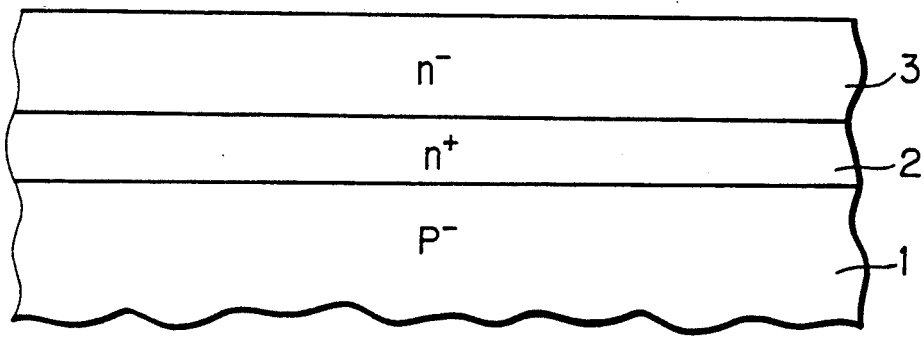
Figure 6C:
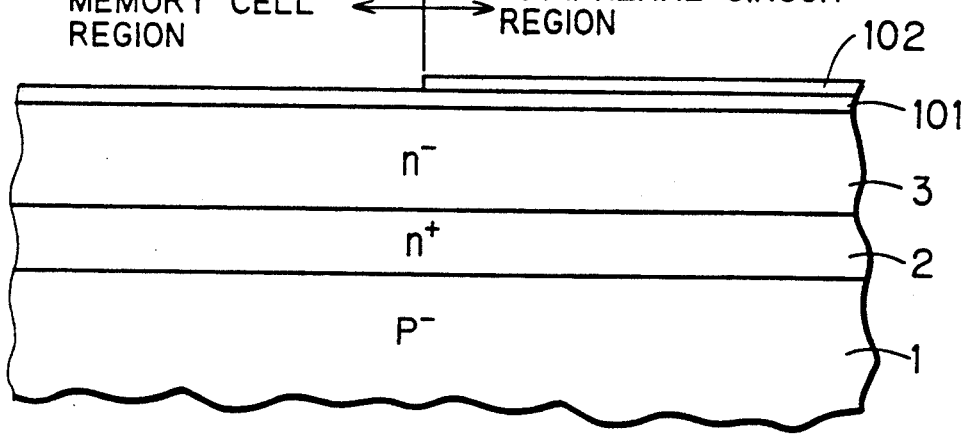
Figure 6D:
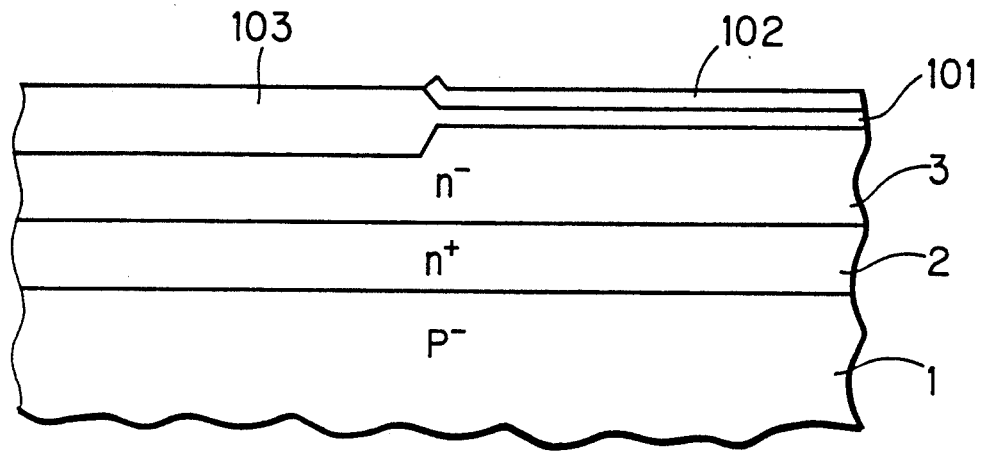
Figure 6E:
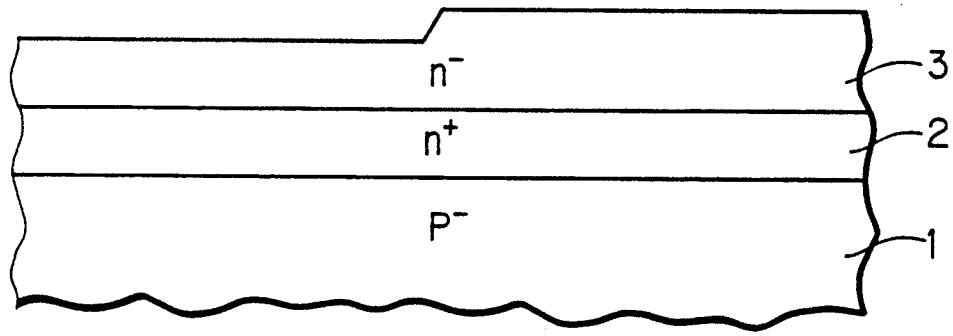
Figure 6F:
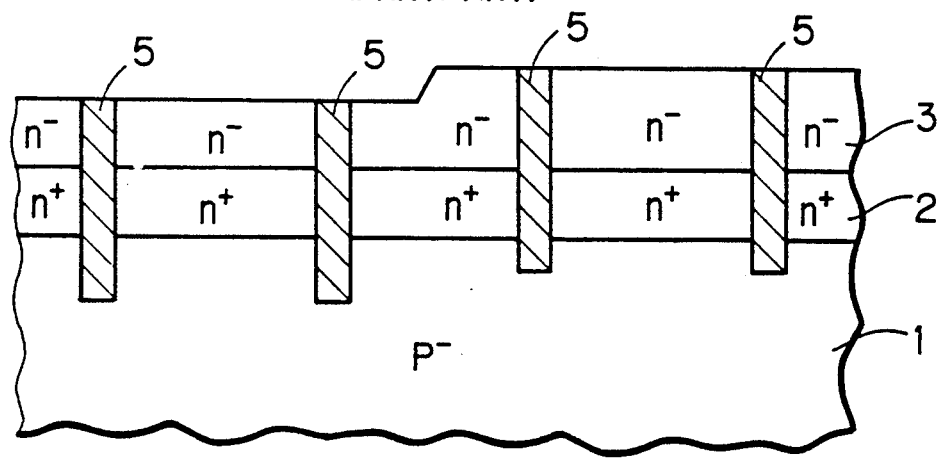

Unlike the step of FIG. 2E, an edge of the nitride film 115 is designed to be on the memory cell region side a little apart from the boundary region between the memory cell region and the peripheral circuit region in the step of FIG. 4A. As a result, when selective oxidation is performed, masked with the nitride film 115, to form the oxide film 116, part of the n⁻ epitaxial layer 13 which is not removed by the oxide film 116 is left in a convex shape in the boundary region between the memory cell region and the peripheral circuit region in the step of FIG. 4B. As shown in FIG. 4C, the nitride film 115 and the oxide films 114 and 116 are entirely removed. The resulting surface of the n⁻ epitaxial layer 13 is flat and is formed with a convex stair 21 in the boundary region between the memory cell region and the peripheral circuit region. Either edge of the convex stair 21 can be used as the alignment mark in a later step.

The respective preferred embodiments describe examples in which LOCOS is used for reducing the semiconductor substrate 11 and the epitaxial layer 13 by required thickness. Plasma etching, however, may be used therefor. In this case, the etching mask may be, for example, a photoresist film or an oxide film. The etching gas may be such gas as $SF_6$ or HBr. Also in this case, the edge positions of the masks are similar to those of the nitride films 112 and 115 shown in FIGS. 2A, 2E and 4A. Further, conditions of respective plasma etchings for thinning the semiconductor substrate 11 and the epitaxial layer 13 are also the same. Since a damaged layer is left in the region which is left by removal by plasma when plasma etching is used, it is preferable to add a step of thermally oxidize and remove the damaged layer.

Although the present invention has been described and illustrated in detail, it is clearly understood that the same is by way of illustration and example only and is not to be taken by way of limitation. The spirit and scope of the present invention should be limited only by the terms of the appended claims.

I claim:

1. A method of manufacturing a semiconductor device, comprising the steps of:
   (a) preparing a first conductivity type semiconductor substrate;
   (b) selectively removing a surface of said semiconductor substrate to thereby provide said semiconductor substrate with a first region formed with a relatively high surface and a second region adjacent to the first region and formed with a relatively low surface;
   (c) forming a second conductivity type buried semiconductor layer of a relatively high impurity concentration with substantially uniform thickness formed on said semiconductor substrate in said first and second regions;
   (d) growing a second conductivity type epitaxial layer of a relatively low impurity concentration in substantially uniform thickness on said buried semiconductor layer; and
   (e) selectively removing said epitaxial layer in said first region to thereby equalize the height of a portion of the surface of said epitaxial layer in said first and second regions, and to provide said surface of said epitaxial layer with a concave or convex step in a boundary portion between said first and second regions.

2. A method of manufacturing a semiconductor device in accordance with claim 1, wherein
   said step (b) includes the steps of:
   forming a first mask in said first region;
   performing first selective oxidation using said first mask to form a first oxide film on said semiconductor substrate in said second region in order to make said semiconductor substrate thinner in said second region; and
   removing said first mask and said first oxide film.

3. A method of manufacturing a semiconductor device in accordance with claim 1, wherein
   said step (c) includes the steps of:
   introducing second conductivity type impurities into the surface of said semiconductor substrate; and
   diffusing said impurities to form said buried semiconductor layer.

4. A method of manufacturing a semiconductor device in accordance with claim 2, wherein
   said step (e) includes the steps of:
   forming a second mask in said second region;
   performing second selective oxidation using said second mask to form a second oxide film on said epitaxial layer in said first region in order to make said epitaxial layer thinner in said first region, and
   removing said second mask and said second oxide film.

5. A method of manufacturing a semiconductor device in accordance with claim 4, wherein
   said second mask has an edge set on the second region apart from the boundary portion between said first and second regions.

6. A method of manufacturing a semiconductor device in accordance with claim 4, wherein
   said second mask has an edge set on the first region apart from the boundary portion between said first and second regions.

7. A method of manufacturing a semiconductor device in accordance with claim 4, wherein
   said first and second selective oxidation steps are performed under the same condition.

8. A method of manufacturing a semiconductor device in accordance with claim 1, further comprising the step of:
   forming a plurality of trench isolating layers reaching said semiconductor substrate from the surface of said epitaxial layer to divide first and second regions into a plurality of element regions.

9. A method of manufacturing a semiconductor device in accordance with claim 8, wherein
   said step of forming a plurality of trench isolating layers is performed by using said concave or convex step as an alignment mark.

10. A method of manufacturing a semiconductor device in accordance with claim 8, further comprising the step of:
    forming transistors in predetermined ones of said plurality of element regions.

11. A method of manufacturing a semiconductor device in accordance with claim 1, wherein
    said step (b) includes the steps of:
    forming a first mask in said first region;
    performing first plasma etching using said first mask to make said semiconductor substrate thinner in said second region., and
    removing said first mask.

12. A method of manufacturing a semiconductor device in accordance with claim 11, wherein
    said step (e) includes the steps of:
    forming a second mask in said second region;
    performing second plasma etching using said second mask to make said epitaxial layer thinner in said first region; and
    removing said second mask.

13. A method of manufacturing a semiconductor device in accordance with claim 12, wherein
    said second mask has an edge set on the second region apart from the boundary portion between said first and second regions 14. A method of manufacturing a semiconductor device in accordance with claim 12, wherein
    said second mask has an edge set on the first region apart from the boundary portion between said first and second regions.

15. A method of manufacturing a semiconductor device in accordance with claim 12, wherein
    said first and second plasma etching steps are performed under the same condition.

* * * * *